United States Patent
Tomita

(10) Patent No.: US 7,291,534 B2
(45) Date of Patent: Nov. 6, 2007

(54) METHOD OF MANUFACTURING SEMICONDUCTOR DEVICE

(75) Inventor: Noriko Tomita, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 11/276,731

(22) Filed: Mar. 13, 2006

(65) Prior Publication Data
US 2006/0211200 A1    Sep. 21, 2006

(30) Foreign Application Priority Data
Mar. 15, 2005   (JP) .............................. 2005-072363

(51) Int. Cl.
    *H01L 21/8234* (2006.01)
(52) U.S. Cl. ................... 438/275; 438/294; 438/981
(58) Field of Classification Search ........ 438/275–279, 438/287–308, 981
    See application file for complete search history.

(56) References Cited

U.S. PATENT DOCUMENTS

| 5,712,178 A | * | 1/1998 | Cho et al. ................ 438/201 |
| 5,861,347 A | * | 1/1999 | Maiti et al. ............... 438/787 |
| 6,133,093 A | * | 10/2000 | Prinz et al. .............. 438/257 |
| 2002/0111046 A1 | | 8/2002 | Park et al. |
| 2004/0169250 A1 | * | 9/2004 | Kobayashi .............. 257/510 |

FOREIGN PATENT DOCUMENTS

| JP | 2000/150665 A | 5/2000 |
| JP | 2000/200836 A | 7/2000 |
| JP | 2002/246480 A | 8/2002 |

* cited by examiner

Primary Examiner—H. Jey Tsai
(74) Attorney, Agent, or Firm—Rabin & Berdo, P.C.

(57) ABSTRACT

A method of manufacturing a semiconductor device has the steps of: preparing a semiconductor substrate having a structure in which first and second active regions are isolated by a field oxide; forming a first insulation film and a first film on the semiconductor substrate; exposing the first active region in the first active region; forming a second insulation film and a first conductive film over the first active region, the second insulation film being thicker than the first insulation film; processing the first conductive film and the second insulation film into a first gate electrode and a first gate insulation film; exposing the second active region in the second active region; forming a third insulation film and a second conductive film on the over the second active region, the third insulation film being thinner than the second insulation film; and processing the second conductive film and the third insulation film into a second gate electrode and a second gate insulation film.

19 Claims, 7 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device which in particular has multiple semiconductor elements with gate insulation films with different thicknesses formed on the same semiconductor substrate.

2. Background Information

Generally, with respect to semiconductor devices, miniaturization and high integration is expected. Presently, in order to achieve such miniaturization and high integration of a semiconductor device, an element isolating process in a method of manufacturing a semiconductor device applies more of an STI (shallow trench isolation) method than the generally used LOCOS (local oxidation silicon) method. Furthermore, also for the purpose of miniaturization and high integration of a semiconductor device, a gate oxide (also called a gate insulation film) in a semiconductor element is made to become thinner. As the gate oxide becomes thinner, a power source voltage required becomes lower.

Although the reduction in voltage is accompanied by the miniaturization and high integration of semiconductor devices, semiconductor elements (also known as liquid crystal drivers) that are used to drive a liquid crystal display etc. must adopt a structure in which a conventional high power source voltage and a conventional low power source voltage are used in combination.

However, while a MOS transistor for low voltage (hereinafter to be referred to as low voltage MOS transistor), which is one of the semiconductor elements constructing the liquid crystal driver, needs a thin gate oxide, a MOS transistor for high voltage (hereinafter to be referred to as high voltage MOS transistor), which is another semiconductor element constructing the liquid crystal driver, needs a comparatively thick gate oxide which is about 40 nm.

Examples of a method of forming gate oxides with different thicknesses on the same semiconductor substrate are exhibited in Japanese Laid-Open Patent Application No. 2000-150665 (hereinafter to be referred to as a patent reference 1), Japanese Laid-Open Patent Application No. 2000-200836 (hereinafter to be referred to as a patent reference 2) and Japanese Laid-Open Patent Application No. 2000-246480 (hereinafter to be referred to as a patent reference 3), for instance. In these conventional methods, mainly, a field oxide (also called an element isolating insulation film) is formed by the LOCOS method, after which a heat oxidation treatment is conducted on the entire surface thereof to form a thick gate oxide for a high voltage MOS transistor. Then, a region in which a high voltage MOS transistor is to be formed is covered with a resist, and while using this resist as a mask, the thick gate oxide in a region in which a low voltage MOS transistor is to be formed is removed by wet etching. Then, the resist used as the mask is removed, and a thin gate oxide for a low voltage MOS transistor is formed.

In case of forming gate oxides with different thicknesses on the same semiconductor substrate according to the above-described conventional methods, it is necessary to have a process of removing the thick gate oxide in the region where the low voltage MOS transistor is to be formed, using hydrofluoric acid (HF). However, having the process of removing such thick gate oxide may cause a problem in which the upper part of the field oxide might be etched of as well.

Particularly, in case of forming the field oxide by the STI method and forming the gate oxide by the heat oxidation treatment as above, the etching rate of the embedded oxidation film (i.e. the field oxide) by the hydrofluoric acid will exceed the etching rate of the oxidation film (i.e. the gate oxide), and the upper part of the field oxide will be removed to a significant degree.

As a result, the upper surface of a field region (also called an element isolating region) where the field oxide is formed becomes lower than the upper surface of an active region (also called an element forming region) of the semiconductor substrate.

Under such circumstances, a step may be formed between the active region and the field region, and in the later process when a gate electrode is patterned, a resist used in a photolithographic process is pooled in this step, which can cause a problem in which the gate electrode cannot be patterned normally.

Furthermore, due to this step formed between the active region and the field region, a part of the semiconductor substrate will be exposed, which can cause problems such a hump phenomenon etc. that deteriorates element characteristics, deterioration in the reliability of the gate insulation film, and so forth.

In view of the above, it will be apparent to those skilled in the art from this disclosure that there exists a need for an improved method of manufacturing a semiconductor device. This invention addresses this need in the art as well as other needs, which will become apparent to those skilled in the art from this disclosure.

SUMMARY OF THE INVENTION

It is therefore an object of the present invention to resolve the above-described problems, and to provide a method of manufacturing a semiconductor device which is capable of preventing any step from being formed between an active region and a field region.

In accordance with one aspect of the present invention, a method of manufacturing a semiconductor device, has the steps of: preparing a semiconductor substrate having a structure in which first and second active regions are isolated by an element isolating insulation film; forming a first insulation film on the semiconductor substrate; forming a first film on the first insulation film; exposing the first active region by etching the first insulation film and the first film over the first active region; forming a second insulation film which is thicker than the first insulation film on the exposed first active region; forming a first conductive film on the second insulation film; forming a first gate electrode and a first gate insulation film over the first active region by processing the first conductive film and the second insulation film; exposing the second active region by etching the first insulation film and the first film over the second active region; forming a third insulation film which is thinner than the second insulation film on the exposed second active region; forming a second conductive film on the third insulation film; and forming a second gate electrode and a second gate insulation film over the second active region by processing the second conductive film and the third insulation film.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Embodiment

One embodiment of the present invention will be described in detail with reference to the drawings.

Structure

Figure 1:
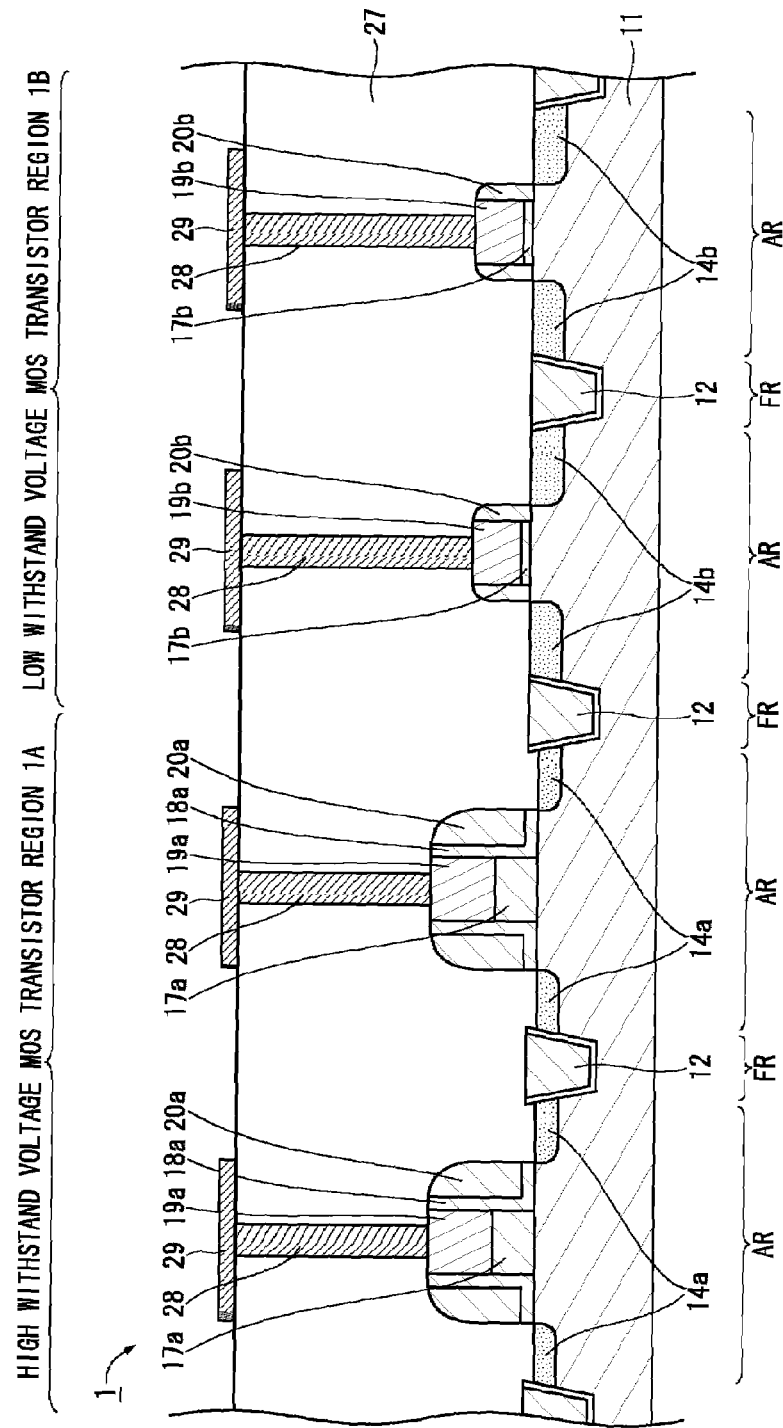
FIG. 1 is a sectional view showing a structure of a semiconductor device 1 according to an embodiment of the present invention.

FIG. 1 is a diagram showing a structure of a semiconductor device 1 according to the embodiment of the present invention. It should be noted that the following description will be based on a sectional structure of the semiconductor device 1, which includes a line connecting a low voltage MOS transistor (also called a low withstand voltage MOS transistor) and a high voltage MOS transistor (also called a high withstand voltage MOS transistor) and which is vertical with a semiconductor substrate 11.

As shown in FIG. 1, the semiconductor device 1 has a structure in which active regions AR (also called element forming regions) and field regions FR (also called element isolating regions) are defined by having field oxides 12 (also called element isolating insulation films) formed in the semiconductor substrate 11.

In the semiconductor substrate 11, on each active region AR in a region 1A (hereinafter to be referred to as a high voltage MOS transistor region 1A) where the high voltage MOS transistor is to be formed, a gate oxide 17a having a first film thickness is formed. On this insulation film 17a, a gate electrode 19a is formed. The surfaces of the gate oxide 17a and the gate electrode 19a are covered with a protective film 18a having an aperture that exposes at least a part of the upper surface of the gate electrode 19a. On the sides of the gate electrode 19a and the gate oxide 17a, sidewall spacers 20a are formed. The protective film 18a is sandwiched between the sidewall spacer 20a and the gate electrode 19a. In addition, the active region AR has a pair of source/drain regions 14a sandwiching a region where a channel is to be formed.

In this way, the high withstand MOS transistor according to this embodiment has the gate oxide 17a having the first film thickness formed in the active region AR of the semiconductor substrate 11, the gate electrode 19a formed on the gate oxide 17a, the sidewall spacers 20a formed on the sides of the gate electrode 19a and the gate oxide 17a, the protective film 18a covering the gate electrode 19a and the gate oxide 17a and sandwiched between the gate electrode 19a and the sidewall spacer 20a, and the pair of source/drain regions 14a formed in the active region AR.

On the other hand, on each active region AR in a region 1B (hereinafter to be referred to as a low voltage MOS transistor region 1B) where the low voltage MOS transistor is to be formed, a gate oxide 17b having a second film thickness is formed. The gate oxide 17b having the second film thickness is thinner than the gate oxide 17a having the first film thickness. On this insulation film 17b, a gate electrode 19b is formed. On the sides of the gate electrode 19b and the gate oxide 17b, sidewall spacers 20b are formed. In addition, the active region AR has a pair of source/drain regions 14b sandwiching a region where a channel is to be formed.

In this way, the low withstand MOS transistor according to this embodiment has the gate oxide 17b having the second film thickness which is thinner than the first film thickness formed in the active region AR of the semiconductor substrate 11, the gate electrode 19b formed on the gate oxide 17b, the sidewall spacers 20b formed on the sides of the gate electrode 19b and the gate oxide 17b, and the pair of source/drain regions 14b formed in the active region AR.

In the above structure, the semiconductor substrate 11 can be a p-type silicon substrate for instance. As described above, on the semiconductor substrate 11, the field oxides 12 are formed. In this embodiment, the field oxides 12 are considered to be formed by the STI method. However, the method of forming the field oxides 12 is not limited to the STI method but may also be the LOCOS method.

As for the gate oxide 17a formed on the active region AR in the high withstand MOS transistor region 1A, a silicon oxide film ($SiO_x$ film) can be applied for instance. The gate oxide 17a should have a thickness (i.e. the first thickness) which is sufficient to not to be damaged by an operating voltage, and such thickness may be around 40 nm (nanometer) for instance.

As described above, the gate electrode 19a is formed on the gate oxide 17a. This gate electrode 19a may be a polysilicon film in which predetermined impurities are doped for instance. The gate electrode 19a may be 300 nm thick for instance.

The protective film 18a covering the gate oxide 17a and the gate electrode 19a serves as a mask for protecting the gate electrode 19a and the gate oxide 17a at the time when a silicon nitride film 15a (q.v. FIG. 5B and FIG. 5C) in the later process of this manufacturing method is etched. Accordingly, the protective film 18a should be made of a material such as silicon oxide ($SiO_x$), which is an insulating material and a material that can be etched selectively with respect to the silicon nitride film 15a. The protective film 18a should be thick enough to protect the gate electrode 19a and the gate oxide 17a in the etching process, and it may be about 10 to 20 nm thick for instance.

Each of the sidewall spacers 20a formed on the sides of the gate electrode 19a and the gate oxide 17a while having the protective film 18a between itself and the sides of the gate electrode 19a and the gate oxide 17a defines a distance between the source/drain region 14a and the gate electrode 19a. The sidewall spacers 20a can be silicon oxide films or silicon nitride films for instance. Here, a width of the sidewall spacer 20a (hereinafter to be referred to as a sidewall spacer width) depends on a driving voltage, but it may be 450 nm for instance.

The source/drain regions 14a formed in the active region AR in the high voltage MOS transistor regions 1A are regions where certain impurities having a predetermined conductivity are doped in high concentration as compared to a well region (not shown). These source/drain regions 14a are formed by implanting predetermined impurities into the active region AR in the semiconductor substrate 11 while using the gate electrode 19a and the sidewall spacers 20a as masks. In case of manufacturing an n-type MOS transistor for instance, the source/drain regions 14a should be regions in which n-type impurities are implanted. Here, the n-type impurities may be n-type ions such as arsenic ions ($As^+$) for instance, and a dose amount thereof may be around $6.0 \times 10^{15}/cm^2$. On the other hand, in case of manufacturing a p-type MOS transistor for instance, the source/drain regions 14a should be regions in which p-type impurities are implanted. Here, the p-type impurities may be p-type ions such as boron ions ($B^+$) for instance, and a dose amount thereof may be around $\sim 5.0 \times 10^{15}/cm^2$.

As for the gate oxide 17b formed on the active region AR in the low withstand MOS transistor region 1B, as with the gate oxide 17a, a silicon oxide film ($SiO_x$ film) can be applied for instance. A thickness of the gate oxide 17b (i.e. the second thickness) can be decided depending on an operating voltage and performance expected from the low voltage MOS transistor, and it may be set to around 7 nm for instance.

As described above, the gate electrode 19b is formed on the gate oxide 17b. As with the gate electrode 19a, this gate electrode 19b may be a polysilicon film which includes predetermined impurities for instance. A thickness of the gate electrode 19b is different from the first thickness of the gate electrode 19a in the high voltage MOS transistor, and it may be set to 250 nm for instance.

Each of the sidewall spacers 20b formed on the sides of the gate electrode 19b and the gate oxide 17b defines a distance between the source/drain region 14b and the gate electrode 19b. The sidewall spacers 20 can be silicon oxide films or silicon nitride films for instance. Here, a width of the sidewall spacer 20b (i.e. a sidewall spacer width) is different from the sidewall spacer width of the sidewall spacer 20a in the high voltage MOS transistor, and it may be 100 nm for instance.

The source/drain regions 14b formed in the active region AR in the low voltage MOS transistor regions 1B are regions where certain impurities having a predetermined conductivity are doped in high concentration as compared to a well region (not shown). These source/drain regions 14b are formed by implanting predetermined impurities into the active region AR in the semiconductor substrate 11 while using the gate electrode 19b and the sidewall spacers 20b as masks. In case of manufacturing an n-type MOS transistor for instance, the source/drain regions 14b should be regions in which n-type impurities are implanted. Here, the n-type impurities may be n-type ions such as arsenic ions ($As^+$) for instance, and a dose amount thereof may be around $6.0 \times 10^{15}/cm^2$. On the other hand, in case of manufacturing a p-type MOS transistor for instance, the source/drain regions 14b should be regions in which p-type impurities are implanted. Here, the p-type impurities may be p-type ions such as boron ions ($B^+$) for instance, and a dose amount thereof may be around $5.0 \times 10^{15}/cm^2$.

The high voltage MOS transistor and the low voltage MOS transistor each having the above described structure are covered with an interlayer insulation film 27. As for this interlayer insulation film 27, a silicon oxide film ($SiO_x$ film) can be applied for instance, and it may be about 1200 nm thick for instance.

In the interlayer insulation film 27, contact holes are formed to expose the upper parts of the gate electrodes 19a and 19b. Then by filling up these contact holes with metals such as tungsten (W), contact plugs 28 are formed. In addition, on the interlayer insulation film 27, metal wirings 29 are formed for the purpose of obtaining electrical conduction with other elements and wiring patterns. The gate electrodes 19a and 19b are electrically connected with the metal wirings 29 via the contact plugs 28, respectively.

Manufacturing Method

Now, a method of manufacturing the semiconductor device 1 according to the embodiment of the present invention will be described in detail with reference to the drawings. FIG. 2A to FIG. 7C are diagrams showing processes of manufacturing the semiconductor device 1 according to this embodiment of the present invention.

Figure 2A:
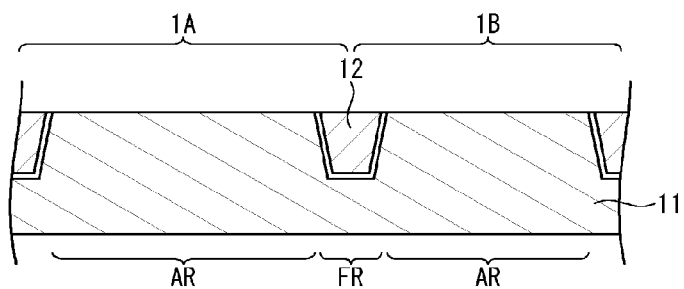
FIG. 2A to FIG. 2C are diagrams showing processes of manufacturing the semiconductor device 1 according to a manufacturing method of the embodiment of the present invention.

In this manufacturing method, first, a semiconductor substrate 11 which is a p-type silicon substrate is prepared, and then field oxides 12 are formed using the STI method for instance. By this process, as shown in FIG. 2A, active regions AR and field regions FR in a high withstand voltage MOS transistor region 1A and a low withstand voltage MOS transistor region 1B are defined.

Figure 2B:
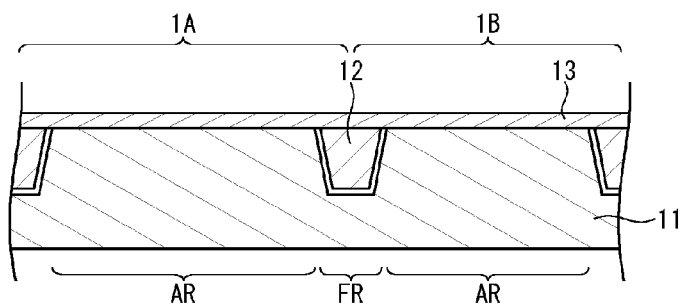
Figure 2C:
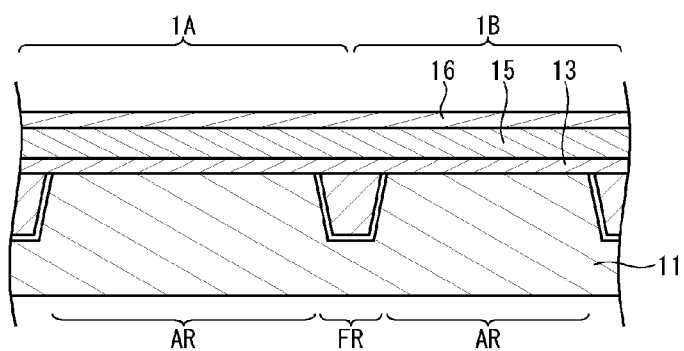

Next, as shown in FIG. 2B, a silicon oxide film ($SiO_x$) 13 which is a first insulation film having a thickness of about 10 nm, for instance, is formed on the surface of the semiconductor substrate 11, the surface having the field oxides 12. This silicon oxide film 13 functions as a buffer film in an etching process to be described later on. Therefore, it is preferable that the silicon oxide film 13 is sufficiently thicker than the first thickness of the gate oxide 17a. By this arrangement, processing a thick film as the gate oxide 17a (i.e. the silicon oxide 17A) directly on the semiconductor substrate 11 becomes unnecessary. The silicon oxide film ($SiO_x$) can be formed by a thermal oxidation treatment. In this thermal oxidation treatment, the semiconductor substrate 11 is heated at 850° C. for 20 minutes in the presence of oxygen, for instance.

Next, using a known CVD (Chemical Vapor Deposition) method, a silicon nitride film (SiN) 15 which is a first film having a thickness of about 20 nm is formed. Then, using a known CVD method, a silicon oxide film 16 which is a second film having a thickness of 10 to 20 nm is formed on the silicon nitride film 15. By these processes, a structure as represented by a cross section structure shown in FIG. 2C can be obtained. In addition, the above silicon nitride film 15 is processed into a silicon nitride film 15a having a predetermined shape in the later process, and the processed silicon nitride film 15a is used as a protective film (i.e. a mask) for preventing the buffer film 13 in the low withstand voltage MOS transistor region 1B from being etched when the buffer film 13 in the high withstand voltage MOS transistor region 1A is removed. Furthermore, the processed silicon nitride film 15a having the predetermined shape is used as a protective film (i.e. a mask) for preventing the semiconductor substrate 11 in the low withstand voltage MOS transistor region 1B from being oxidized when a silicon oxide film 17A which will be processed into the gate oxide 17a is formed on the semiconductor substrate 11 in the high withstand voltage MOS transistor region 1A. On the other hand, the silicon oxide film 16 is processed into a silicon nitride film 16a having a predetermined shape in the later process, and the processed silicon oxide film 16a is used as a protective film (i.e. a mask) for processing the silicon nitride film 15 which lies under the silicon oxide film 16a into the silicon nitride film 15a having the predetermined shape.

Figure 3A:
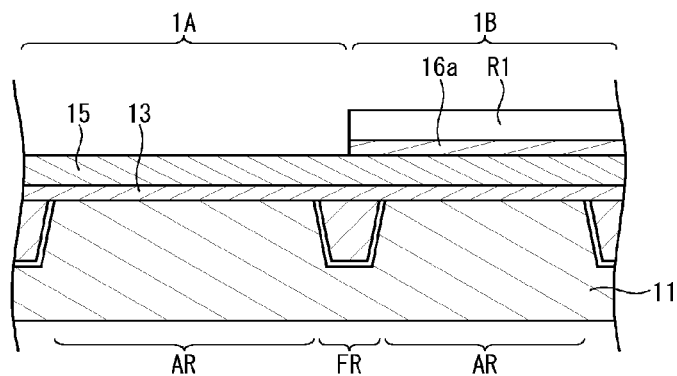
FIG. 3A to FIG. 3C are diagrams showing processes of manufacturing the semiconductor device 1 according to the manufacturing method of the embodiment of the present invention.

Next, by conducting a known photolithographic process on the formed silicon oxide film 16, a photo-resist R1 is formed in the low withstand voltage MOS transistor region 1B. Then, using a known RIE (Reactive Ion Etching) method for instance, the silicon oxide film 16 in the high withstand voltage MOS transistor region 1A is removed while using the photo-resist R1 as a mask. By these processes, as shown in FIG. 3A, the silicon nitride film 15 in the high withstand voltage MOS transistor region 1A is exposed while the silicon oxide film 16a remains in the low withstand voltage MOS transistor region 1B.

Figure 3B:
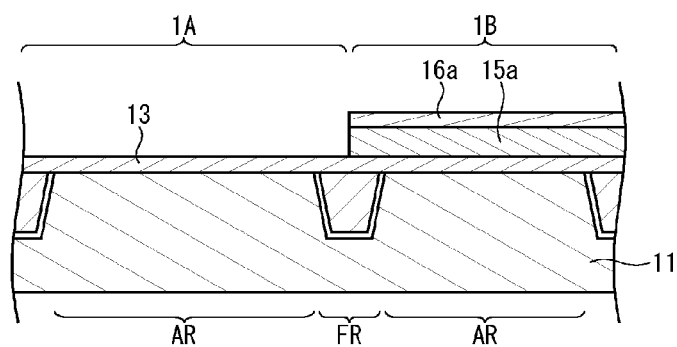

Next, the photo-resist R1 is removed, after which the silicon nitride film 15 in the high withstand voltage MOS transistor region 1A is removed while using the silicon oxide film 16a remaining in the low withstand voltage MOS transistor region 1B as a mask. By this process, as shown in FIG. 3B, the silicon oxide film 13 in the high withstand voltage MOS transistor region 1A is exposed while the silicon nitride film 15a remains only in the low withstand voltage MOS transistor region 1B. Here, in order to remove only the exposed silicon nitride film 15 while preventing the semiconductor substrate 11 from being damaged, it is preferable to use a wet etching method for etching the silicon nitride film 15. In this wet etching process, for instance, a thermal phosphoric acid liquid of approximately 86% concentration at a temperature of around 160° C. is used. Such wet etching using the thermal phosphoric acid liquid can selectively remove a silicon nitride film with respect to a silicon oxide film. In other words, under the predetermined conditions including the usage of the thermal phosphoric acid liquid, becomes an etching rate of the silicon nitride film is sufficiently larger than an etching rate of the silicon oxide film, it is possible to substantially etch only the silicon nitride film.

Figure 3C:
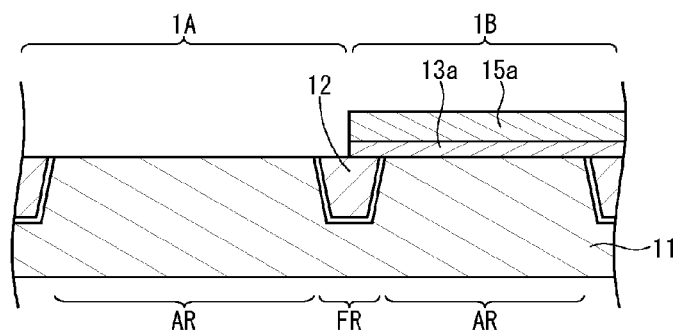

Next, the silicon oxide film 13 exposed in the high withstand voltage MOS transistor region 1A and the silicon oxide film 16a remaining in the low withstand voltage MOS transistor 1B are removed. At this time, since the silicon nitride film 15a is functioning as a mask, a silicon oxide film 13a remains in the low withstand voltage MOS transistor region 1B. By these processes, as shown in FIG. 3C, the semiconductor substrate 11 and the field oxides 12 in the high withstand voltage MOS transistor region 1A are exposed while the low withstand voltage MOS transistor region 1B is covered by the silicon oxide film 13a. Here, in order to remove only the exposed silicon oxide film 13 while preventing the semiconductor substrate 11 from being damaged, it is preferable to use a wet etching method for etching the silicon oxide film 13. In this wet etching process, for instance, a hydrofluoric acid liquid of approximately 5% concentration is used. Such wet etching using the hydrofluoric acid liquid can selectively remove a silicon oxide film with respect to a silicon nitride film. In other words, under the predetermined conditions including the usage of the hydrofluoric acid liquid, an etching rate of the silicon oxide film will be sufficiently larger than an etching rate of the silicon nitride film, and it will be possible to substantially etch only the silicon oxide film.

Figure 4A:
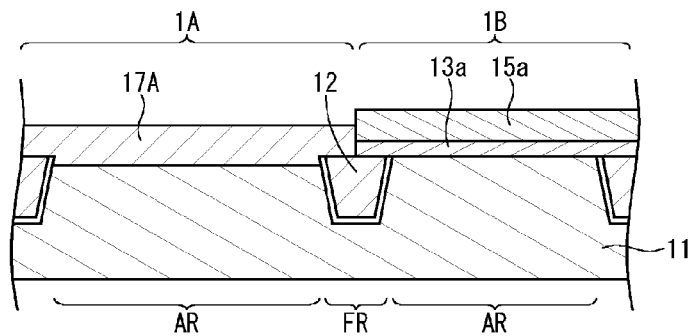
FIG. 4A to FIG. 4C are diagrams showing processes of manufacturing the semiconductor device 1 according to the manufacturing method of the embodiment of the present invention.

Next, by conducting a thermal oxidation treatment on the exposed surface of the semiconductor substrate 11 in the high withstand voltage MOS transistor region 1A, as shown in FIG. 4A, a silicon oxide film 17A which is a second insulation film having the first thickness, for instance, is formed in the high withstand voltage MOS transistor region 1A. At this time, since the silicon nitride film 15a is functioning as a mask for the thermal oxidation treatment, the silicon oxide film 17A is formed only in the high withstand voltage MOS transistor region 1A. Here, as described above, the first thickness is the same as the thickness of the gate oxide 17a for the high withstand voltage MOS transistor. The silicon oxide film 17A is an unprocessed film of the gate oxide 17a. The thickness of the silicon oxide film 17A (i.e. the first thickness) may be around 40 nm for instance. In this thermal oxidation treatment, the semiconductor substrate 11 is heated at 850° C. for 40 minutes in the presence of oxygen, for instance.

Figure 4B:
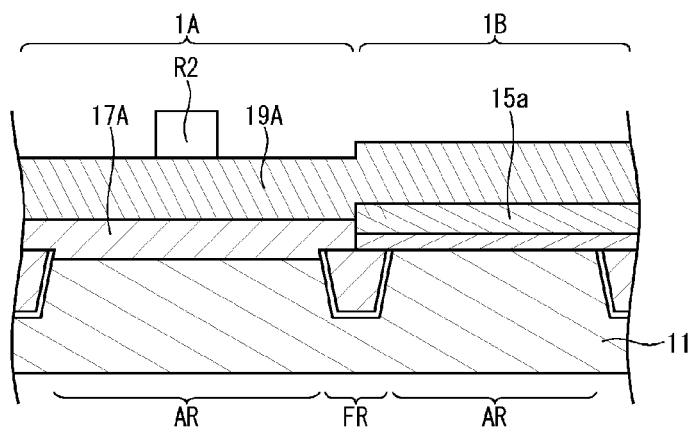

Next, using a known CVD method for instance, a polysilicon film 19A which is a first conductive film including predetermined impurities is formed over the entire surface of the semiconductor substrate 11 where the silicon oxide film 17A is formed. The polysilicon film 19A is formed to the thickness of around 300 nm for instance. Then, by conducting a known photolithographic process on the formed polysilicon film 19A, a photo-resist R2 having the same top face shape as the gate electrode 19a is formed on the polysilicon film 19A as shown in FIG. 4B.

Figure 4C:
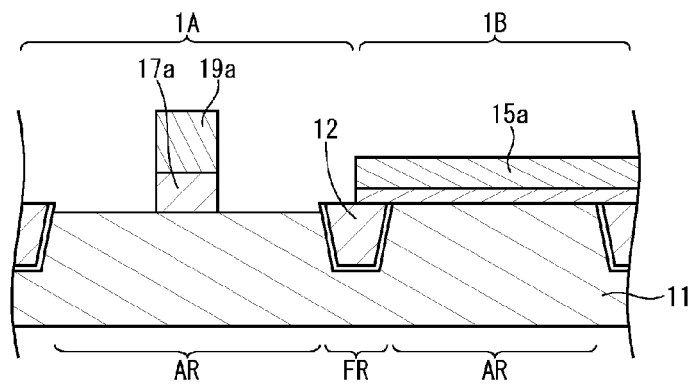

Next, using a known RIE method for instance, the polysilicon film 19A is etched while using the photo-resist R2 as a mask. By this process, as shown in FIG. 4C, the gate electrode 19a including the predetermined impurities is formed in the high withstand voltage MOS transistor region 1A, and the silicon oxide film 17A under the gate electrode 19a is processed into the gate oxide 17a.

Figure 5A:
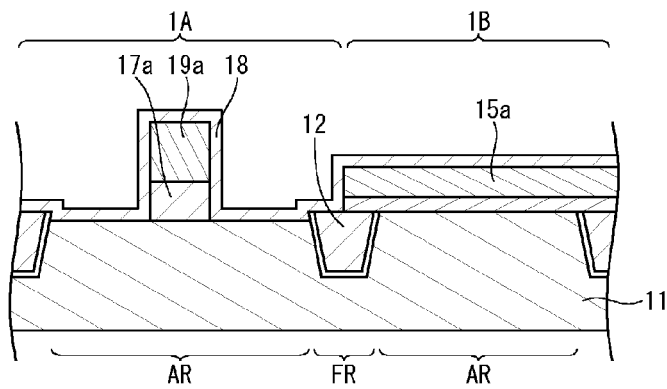
FIG. 5A to FIG. 5C are diagrams showing processes of manufacturing the semiconductor device 1 according to the manufacturing method of the embodiment of the present invention.
Figure 5B:
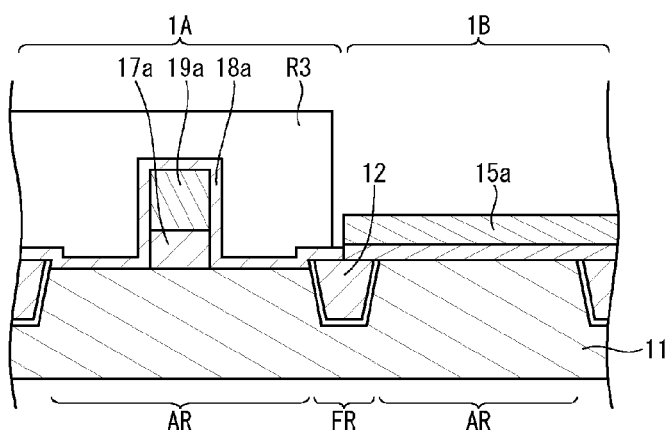
Figure 5C:
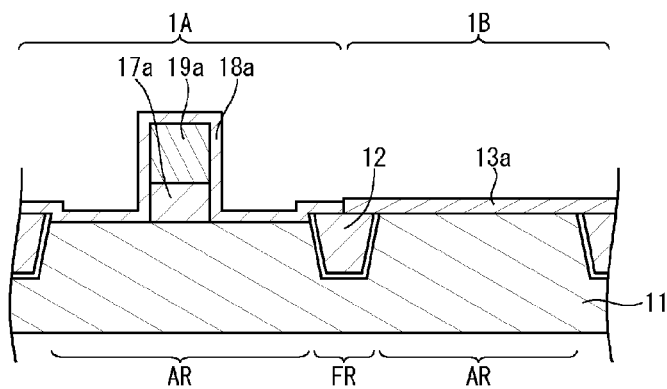

Next, using a known CVD method for instance, a silicon oxide film 18 having a thickness of around 10 nm is formed over the entire surface of the semiconductor substrate 11 where the gate oxide 17a and the gate electrode 19a are formed in the high withstand voltage MOS transistor region 1A as shown in FIG. 5A. This silicon oxide film 18 is an unprocessed film of the above protective film 18a.

Next, by conducting a known photolithographic process on the formed silicon oxide film 18, a photo-resist R3 covering the silicon oxide film 18 in the high withstand voltage MOS transistor region 1A is formed, the silicon oxide film 18 being a fourth insulation film for protecting the gate electrode 19a and the gate oxide 17a from being etched. Then, using a known RIE method for instance, the silicon oxide film 18 in the low withstand voltage MOS transistor region 1B is removed while using the photo-resist R3 as a mask. By these processes, as shown in FIG. 5B, a protective film 18a for protecting the gate electrode 19a and the gate oxide 17a is formed in the high withstand voltage MOS transistor region 1A while the silicon nitride film 15a in the low withstand voltage MOS transistor region 1B is exposed.

Next, the photo-resist R3 is removed, after which the silicon nitride film 15a remaining in the low withstand voltage MOS transistor region 1B is removed. By this process, as shown in FIG. 5C, the silicon oxide film 13a in the low withstand voltage MOS transistor region 1B is exposed. Here, in order to remove only the silicon nitride film 15a while preventing the semiconductor substrate 11 form being damaged, it is preferable to use the same wet etching method as in the etching process of the silicon nitride film 15 shown in FIG. 3B.

Figure 6A:
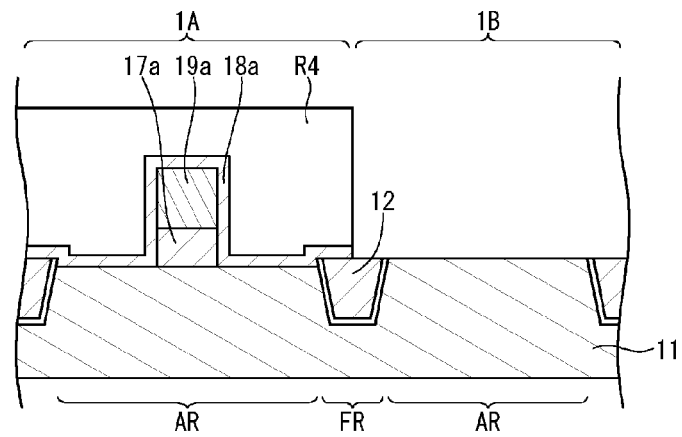
FIG. 6A to FIG. 6C are diagrams showing processes of manufacturing the semiconductor device 1 according to the manufacturing method of the embodiment of the present invention.
Figure 6B:
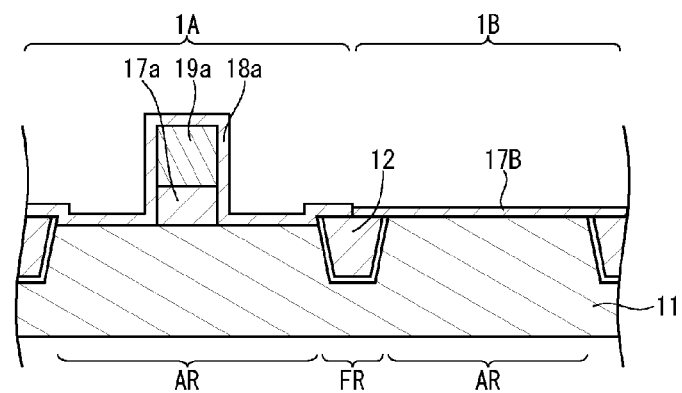

Next, by conducting a known photolithographic process on the entire surface of the semiconductor substrate 11 where the protective film 18a and the silicon oxide film 13a are exposed, a photo-resist R4 covering the silicon oxide film 18a in the high withstand voltage MOS transistor region 1A is formed, the silicon oxide film 18a being a film for protecting the gate electrode 19a and the gate oxide 17a from being etched. Then, the silicon oxide film 13a remaining in the low withstand voltage MOS transistor region 1B is removed while using the photo-resist R4 as a mask. By this process, as shown in FIG. 6A, the semiconductor substrate 11 in the low withstand voltage MOS transistor region 1B is exposed. Here, in order to remove only the silicon oxide film 13a while preventing the semiconductor substrate 11 form being damaged, it is preferable to use the same wet etching method as in the etching process of the silicon oxide film 13 shown in FIG. 3C Next, the photo-resist R4 covering the protective film 18a in the high withstand voltage MOS transistor region 1A is removed. Then, by conducting a known photolithographic process on the exposed surface of the semiconductor substrate 11 in the low withstand voltage MOS transistor region 1B, as shown in FIG. 6B, a silicon oxide film 17B which is a third insulation film having a second thickness, for instance, is formed on the low withstand voltage MOS transistor region 1B. Here, as described above, the second thickness is the same as the thickness of the gate oxide 17b for the low withstand voltage MOS transistor and it is thinner than the first thickness. In addition, because the second thickness is thinner than the silicon oxide film 18a which is the protective film, it is possible to reduce possible damage to the gate electrode 19a and the semiconductor substrate 11 when forming the silicon oxide film 17B. The second thickness may be around 7 nm for instance.

Figure 6C:
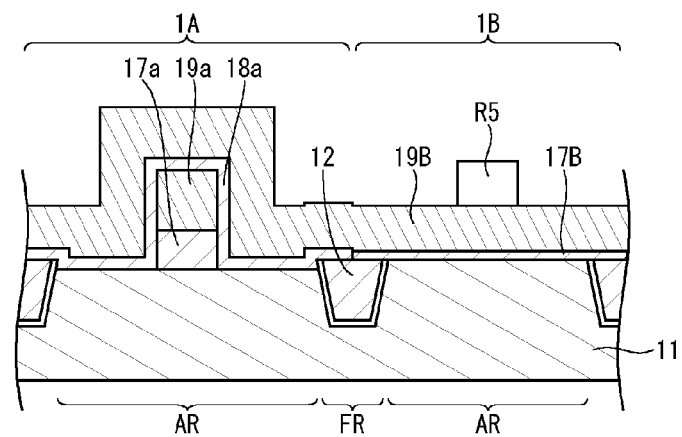

Next, using a known CVD method for instance, a polysilicon film 19B which is a second conductive film including predetermined impurities is formed over the entire surface of the semiconductor substrate 11 where the silicon oxide film 17B is formed. The polysilicon film 19B is formed to a thickness of around 250 nm for instance. Next, by conducting a known photolithographic process on the formed polysilicon film 19B, a photo-resist R5 having the same top face shape as the gate electrode 19b is formed on the polysilicon film 19B as shown in FIG. 6C.

Figure 7A:
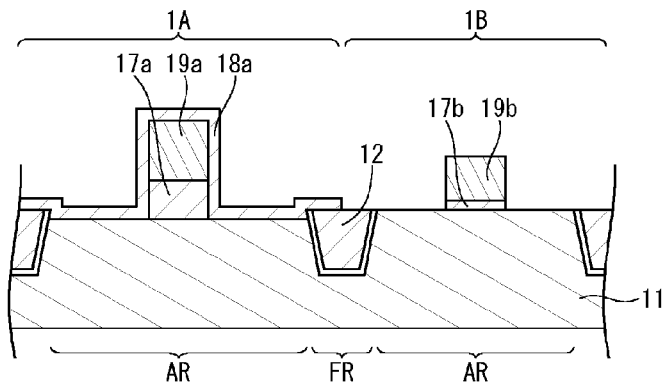
FIG. 7A to FIG. 7C are diagrams showing processes of manufacturing the semiconductor device 1 according to the manufacturing method of the embodiment of the present invention.

Next, using a known RIE method for instance, the polysilicon film 19B is etched while using the photo-resist R5 as a mask. By this process, as shown in FIG. 7A, the gate electrode 19b including the predetermined impurities is formed on the low withstand voltage MOS transistor region 1B and the silicon oxide film 17B under the gate electrode 19b is processed into the gate oxide 17b.

Figure 7B:
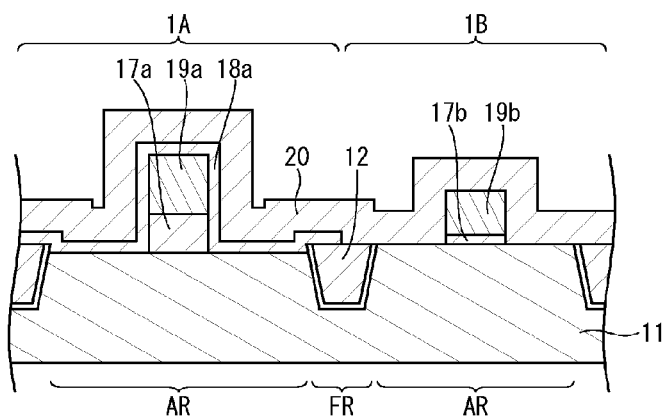

Next, using a known CVD method for instance, a silicon nitride film 20 having a thickness of around 100 nm is formed over the entire surface of the semiconductor substrate 11 where the gate oxides 17a and 17b and the gate electrodes 19a and 19b are formed, as shown in FIG. 7B.

Figure 7C:
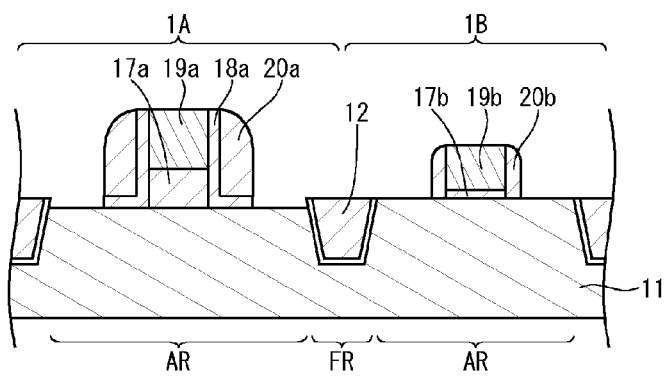

Next, the silicon nitride film 20 is etched by using an anisotropic etching method for instance. By these processes, as shown in FIG. 7C, sidewall spacers 20a, which are insulation films sandwiching the protective film 18a between themselves and the gate electrode 19a and gate oxide 17a, respectively, are formed on the sides of the gate electrode 19a and the gate oxide 17a. At the same time, as shown in FIG. 7C, sidewall spacers 20b, which are insulation films, are formed on the sides of the gate electrode 19b and the gate oxide 17b. Here, since the height of the gate electrode 19a and the gate oxide 17a differs from the height of the gate electrode 19b and the gate oxide 17b, it is possible to simultaneously form the sidewall spacers 20a and 20b with different sidewall spacer width.

Taking the processes described above, the gate oxide 17a with the first thickness for the high withstand voltage MOS transistor and the gate oxide 17b with the second thickness, which is thinner than the first thickness, for the low withstand voltage MOS transistor are formed on the same semiconductor substrate 11.

Next, predetermined impurities are implanted into the active regions AR of the semiconductor substrate 11 while using the gate electrodes 19a and 19b, the sidewall spacers 20a and 20b (including the protective film 18a) and the field oxides 12 as masks, by which a pair of source/drain regions 14a and 14b are formed in the active regions AR of each of the high withstand voltage MOS transistor region 1A and the low withstand voltage MOS transistor region 1B in a self-aligning manner, respectively. By these processes, the high withstand voltage MOS transistor and the low withstand voltage MOS transistor are formed on the same semiconductor substrate 11.

Next, by depositing silicon oxide on the semiconductor substrate 11 so that the high withstand voltage MOS transistor and the low withstand voltage MOS transistor on the semiconductor substrate 11 are buried, an interlayer insulation film 27 is formed. Then, contact holes exposing the gate electrodes 19a and 19b are formed in the interlayer insulation film 27 using a known photolithographic process and a known etching process, and they are filled up with conductive materials such as tungsten (W). By these processes, contact plugs 28 are formed in the interlayer insulation film 27. Then, metal wirings 29 are formed on the interlayer insulation film 27.

Taking the processes described above, the semiconductor device 1 having the structure as represented by the cross section structure shown in FIG. 1 can be produced.

As described above, according to this embodiment of the present invention, first, a semiconductor substrate (11) having a structure in which a first element formation region (e.g. the active region AR in the high voltage MOS transistor region 1A) and a second element formation region (e.g. the active region AR in the low voltage MOS transistor region 1B) are isolated by a field oxide (12) is prepared. Then, a first insulation film (13) is formed on the semiconductor substrate (11), after which a first film (15) is formed on the first insulation film (13).

Next, the first element formation region is exposed by removing the first insulation film (13) and the first film (15) on the first element formation region. Then, a second insulation film (17A) which is thicker than the first insulation film (13) is formed on the exposed surface of the first element formation region, after which a first conductive film (19A) is formed on the second insulation film (17A). Then, by processing the first conductive film (19A) and the second insulation film (17A), a first gate electrode (19a) and a first gate oxide (17a) are formed on the first element formation region.

Next, the second element formation region is exposed by removing the first insulation film (13a) and the first film (15a) on the second element formation region. Then, a third insulation film (17B) which is thinner than the second insulation film (17A) is formed on the exposed surface of the second element formation film, after which a second conductive film (19B) is formed on the third insulation film (17B). Then, by processing the second conductive film (19B) and the third insulation film (17B), a second gate electrode (19b) and a second gate oxide (17b) are formed on the second element formation region.

In this embodiment, the first insulation film, which is thinner than the second insulation film which is to be processed into the gate oxide for high withstand voltage, is formed immediately above the semiconductor substrate. With this structure, it is no longer necessary to etch a comparatively thick film, such as the gate oxide for high withstand voltage, immediately above the semiconductor substrate, at the time of forming the gate oxide for low withstand voltage. Therefore, it is possible to prevent the field oxide, which is the trench part, from being etched too much, at the time of etching the film immediately above the semiconductor substrate. This means that it is possible to prevent any step from being formed between the active region and the field region. Furthermore, in this embodiment, since the gate electrode for high withstand voltage and the gate electrode for low withstand voltage are formed separately, the gate electrodes can be formed in different thicknesses. As a result, sidewall spacers with different widths can be formed on the sides of these electrodes, respectively, at the same time.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2005-72363. The entire disclosures of Japanese Patent Application No. 2005-72363 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or portion of a device includes hardware and/or software that is constructed and/or programmed to carry out the desired function.

Moreover, terms that are expressed as "means-plus function" in the claims should include any structure that can be utilized to carry out the function of that portion of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A method of manufacturing a semiconductor device, comprising:
    (a) preparing a semiconductor substrate having a structure in which first and second active regions are isolated by an element isolating insulation film;
    (b) forming a first insulation film on the semiconductor substrate, the first insulation film covering the first and second active regions and the element isolating insulation film;
    (c) forming a first film on the first insulation film;
    (d) exposing the first active region by etching the first insulation film and the first film over the first active region;
    (e) forming a second insulation film which is thicker than the first insulation film on the exposed first active region;
    (f) forming a first conductive film on the second insulation film;
    (g) forming a first gate electrode and a first gate insulation film over the first active region by processing the first conductive film and the second insulation film;
    (h) exposing the second active region by etching the first insulation film and the first film over the second active region;
    (i) forming a third insulation film which is thinner than the second insulation film on the exposed second active region;
    (j) forming a second conductive film on the third insulation film; and
    (k) forming a second gate electrode and a second gate insulation film over the second active region by processing the second conductive film and the third insulation film.

2. The method of manufacturing a semiconductor device according to claim 1, further comprising:
    forming sidewall spacers on the sides of the first and second gate electrodes, respectively.

3. The method of manufacturing a semiconductor device according to claim 1, wherein
    the second and third insulation films are oxide films formed by thermal oxidation treatments.

4. The method of manufacturing a semiconductor device according to claim 1, wherein
    an etching rate of the first film under predetermined conditions differs from an etching rate of the first insulation film under the predetermined conditions.

5. The method of manufacturing a semiconductor device according to claim 1, wherein
    the first insulation film is an oxide film, and the first film is a nitride film.

6. The method of manufacturing a semiconductor device according to claim 1, further comprising:
    forming a second film on the first film.

7. The method of manufacturing a semiconductor device according to claim 6, wherein
    an etching rate of the second film under predetermined conditions differs from an etching rate of the first film under the predetermined conditions.

8. The method of manufacturing a semiconductor device according to claim 6, wherein
    the first film is a nitride film, and
    the second film is an oxide film.

9. The method of manufacturing a semiconductor device according to claim 1, further comprising:
forming a fourth insulation film covering the first gate electrode and the first gate insulation film.

10. The method of manufacturing a semiconductor device according to claim 9, wherein
an etching rate of the fourth insulation film under predetermined conditions differs from an etching rate of the first film under the predetermined conditions.

11. The method of manufacturing a semiconductor device according to claim 9, wherein
the first film is a nitride film, and
the fourth insulation film is an oxide film.

12. The method of manufacturing a semiconductor device according to claim 5, wherein
the first insulation film is removed using a fluorinated acid liquid, and
the first film is removed using a thermal phosphoric acid liquid.

13. The method of manufacturing a semiconductor device according to claim 8, wherein
the first film is removed using a thermal phosphoric acid liquid, and
the second film is removed using a fluorinated acid liquid.

14. The method of manufacturing a semiconductor device according to claim 11, wherein
the first film is removed using a thermal phosphoric acid liquid.

15. The method of manufacturing a semiconductor device according to claim 1, wherein step (c) is performed after step (b) and step (d) is performed after step (c).

16. The method of manufacturing a semiconductor device according to claim 15, wherein step (e) is performed after step (d), step (f) is performed after step (e), and step (g) is performed after step (f).

17. The method of manufacturing a semiconductor device according to claim 16, wherein step (h) is performed after step (g), step (i) is performed after step (h), step (j) is performed after step (i), and step (k) is performed after step (j).

18. The method of manufacturing a semiconductor device according to claim 1, wherein step (e) is performed after step (d), step (f) is performed after step (e), and step (g) is performed after step (f).

19. The method of manufacturing a semiconductor device according to claim 18, wherein step (h) is performed after step (g), step (i) is performed after step (h), step (j) is performed after step (i), and step (k) is performed after step (j).

* * * * *